(12) United States Patent
Moon et al.

(10) Patent No.: US 10,911,104 B2
(45) Date of Patent: Feb. 2, 2021

(54) NEAR-FIELD COMMUNICATION CIRCUIT AND OPERATION METHOD OF THE SAME

(71) Applicant: SAMSUNG ELECTRONICS CO., LTD., Suwon-si (KR)

(72) Inventors: Byeong-Taek Moon, Seoul (KR); Jun-Ho Kim, Seoul (KR); Young-Joo Lee, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/654,980

(22) Filed: Oct. 16, 2019

(65) Prior Publication Data
US 2020/0169300 A1 May 28, 2020

(30) Foreign Application Priority Data
Nov. 27, 2018 (KR) .................. 10-2018-0148768

(51) Int. Cl.
*H04B 5/02* (2006.01)
*H04B 5/00* (2006.01)
*H03L 7/081* (2006.01)
*H04W 4/80* (2018.01)
*H03K 5/135* (2006.01)
*H03K 5/00* (2006.01)

(52) U.S. Cl.
CPC ............ *H04B 5/02* (2013.01); *H03K 5/135* (2013.01); *H03L 7/0814* (2013.01); *H04B 5/0031* (2013.01); *H04W 4/80* (2018.02); *H03K 2005/00058* (2013.01)

(58) Field of Classification Search
CPC ......... H04B 5/02; H04B 5/0031; H04W 4/80; H03K 5/135; H03K 2005/00058; H03L 7/0814
See application file for complete search history.

(56) References Cited

U.S. PATENT DOCUMENTS

| | | | |
|---|---|---|---|
| 7,347,379 B2 | 3/2008 | Ward et al. | |
| 7,598,872 B2 * | 10/2009 | Pl ss ................... | G06K 7/10039 340/572.4 |
| 8,934,836 B2 | 1/2015 | Lefley | |
| 9,000,892 B2 | 4/2015 | Hinman et al. | |
| 9,124,413 B2 | 9/2015 | Savoj | |
| 9,344,153 B2 | 5/2016 | Kim et al. | |
| 9,450,646 B2 | 9/2016 | Wong et al. | |
| 9,853,697 B2 | 12/2017 | Kim et al. | |
| 9,941,934 B2 | 4/2018 | Bernard et al. | |
| 2012/0081131 A1 * | 4/2012 | Hausmann .......... | H04B 5/0081 324/654 |
| 2018/0091192 A1 * | 3/2018 | Tramoni .............. | H04B 5/0031 |

* cited by examiner

*Primary Examiner* — Nguyen T Vo
(74) *Attorney, Agent, or Firm* — Volentine, Whitt & Francos, PLLC

(57) ABSTRACT

A near-field communication (NFC) circuit includes a transmitter that generates a transmission signal based on a reference clock signal and transmits the transmission signal through an antenna; a clock recovery circuit that receives a detection signal through the antenna responsive to the transmission signal and recovers a recovered clock signal from the detection signal; a phase detector that detects a phase change of the recovered clock signal; and a controller that determines, based on the phase change of the recovered clock signal, whether an NFC tag external to the NFC circuit is located within a communication range of the NFC circuit.

20 Claims, 15 Drawing Sheets

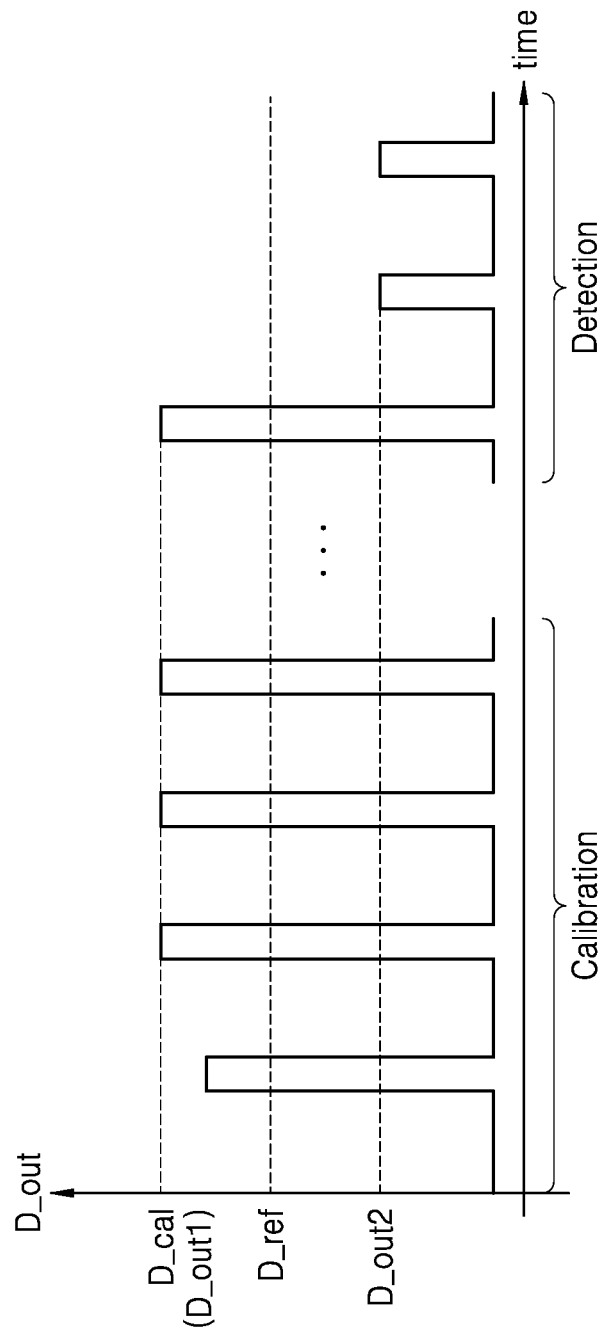

NEAR-FIELD COMMUNICATION CIRCUIT AND OPERATION METHOD OF THE SAME

CROSS-REFERENCE TO RELATED APPLICATION

A claim of priority under 35 U.S.C. § 119 is made to Korean Patent Application No. 10-2018-0148768, filed on Nov. 27, 2018, in the Korean Intellectual Property Office, the entire contents of which are hereby incorporated by reference.

BACKGROUND

The present disclosure relates to near-field communication (NFC), and more particularly to NFC circuits and methods of operating the NFC circuits.

NFC is a wireless communication technology. Wireless communication systems that utilize NFC provide the capability of a device to both write data to and read data from another device(s) over a relatively short communication range, and may be implemented inexpensively and provide highly secure communication. However, as an NFC circuit continuously maintains a reader mode, power consumption is increased. Therefore, when a tag accesses an NFC circuit that is in a low power standby mode, a reader mode is initiated in the NFC circuit. Various solutions are required to detect tag access in a standby mode.

SUMMARY

Embodiments of the inventive concepts provide a near-field communication (NFC) circuit capable of reducing power consumption while enhancing the performance of detecting an NFC tag, and a method of operating the NFC circuit.

Embodiments of the inventive concepts provide a near-field communication (NFC) circuit including a transmitter configured to generate a transmission signal based on a reference clock signal and to transmit the transmission signal through an antenna; a clock recovery circuit configured to receive a detection signal through the antenna responsive to the transmission signal and to recover a recovered clock signal from the detection signal; a phase detector configured to detect a phase change of the recovered clock signal; and a controller configured to determine, based on the phase change of the recovered clock signal, whether an NFC tag external to the NFC circuit is located within a communication range of the NFC circuit.

Embodiments of the inventive concepts further provide a method of operating an NFC circuit operable in a standby mode and a reader mode. The method in the standby mode including transmitting a transmission signal generated based on a reference clock signal through an antenna; receiving through the antenna a detection signal from an NFC tag external of the NFC circuit according to the transmission signal; recovering a recovered clock signal from the detection signal; detecting a phase change of the recovered clock signal; and detecting the NFC tag based on the phase change of the recovered clock signal.

Embodiments of the inventive concepts still further provide a method of operating an NFC circuit including operating in a standby mode to detect whether an NFC tag is located within a communication range; and operating in a reader mode to communicate a data signal with the NFC tag when the NFC tag is located within the communication range. The operating in the standby mode includes transmitting a transmission signal generated based on a reference clock signal through an antenna, receiving through the antenna a detection signal from the NFC tag according to the transmission signal, recovering a recovered clock signal from the detection signal, and detecting the NFC tag based on a phase change of the recovered clock signal.

BRIEF DESCRIPTION OF THE DRAWINGS

Embodiments of the inventive concepts will be more clearly understood from the following detailed description taken in conjunction with the accompanying drawings in which:

FIG. 7 illustrates a graph of operations of an NFC circuit according to embodiments of the inventive concepts;

DETAILED DESCRIPTION OF THE EMBODIMENTS

Hereinafter, embodiments of the inventive concepts will be described in detail with reference to the accompanying drawings.

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

Figure 1:
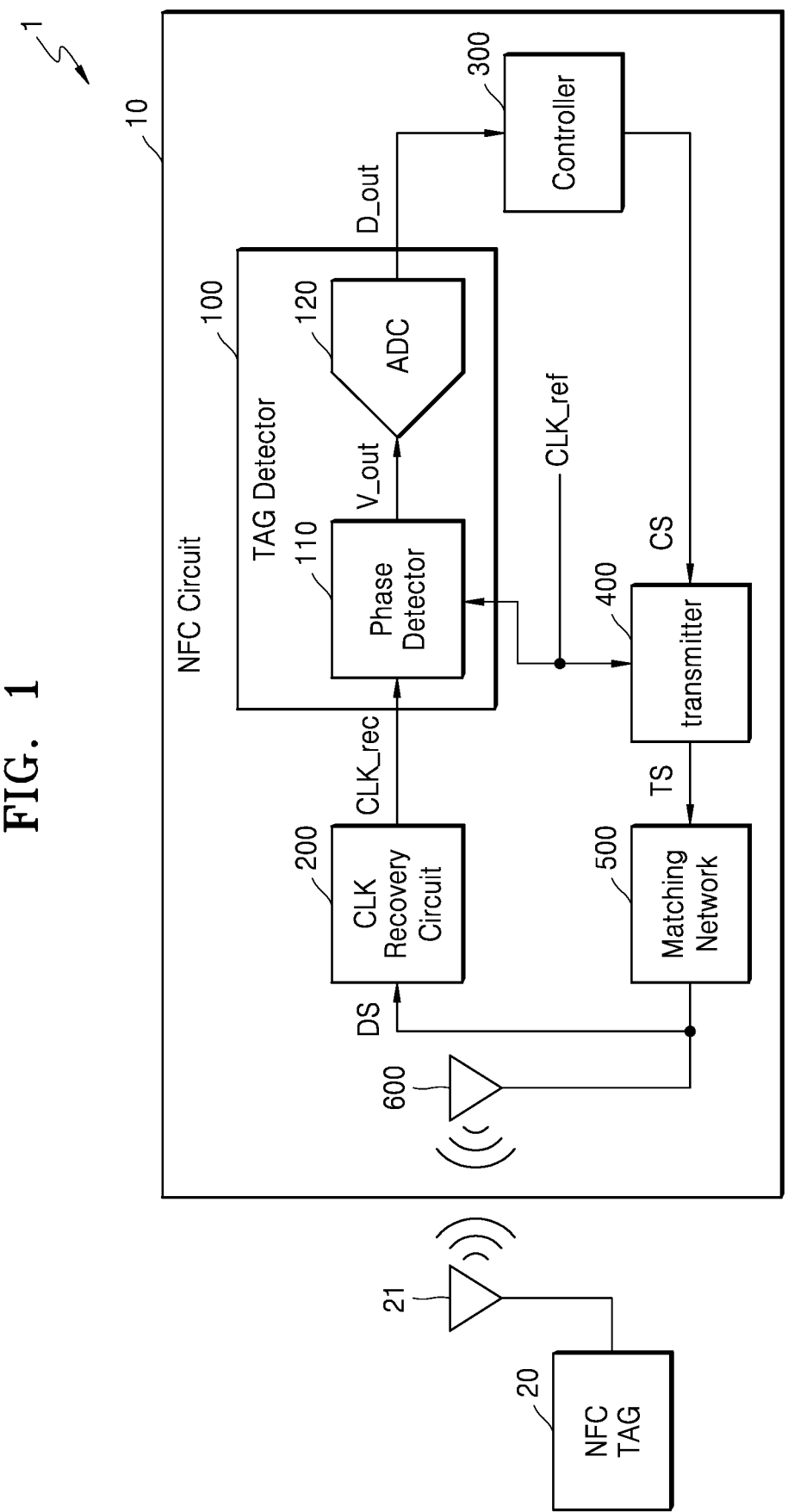
FIG. 1 illustrates a block diagram of a near-field communication (NFC) system including an NFC circuit according to embodiments of the inventive concepts.
Figure 2:
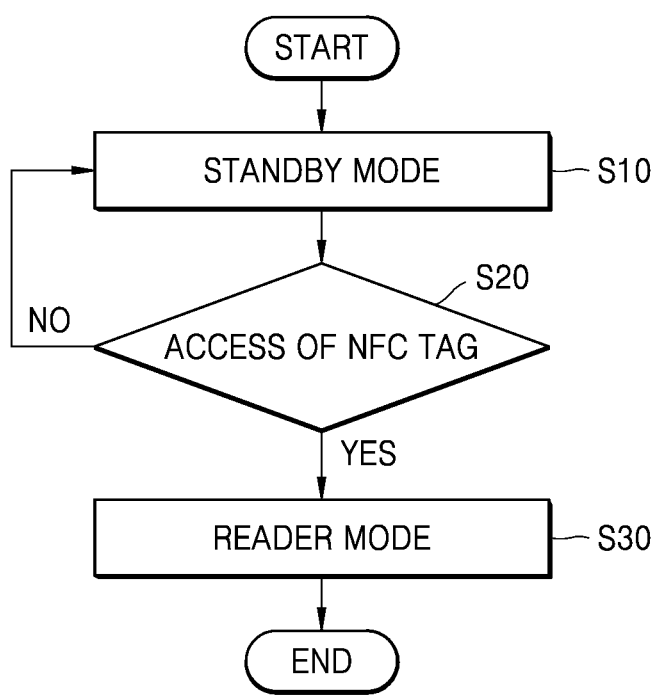
FIG. 2 illustrates a flowchart of an operation of an NFC circuit according to embodiments of the inventive concepts.

FIG. 1 illustrates a block diagram of a near-field communication (NFC) system including an NFC circuit according to embodiments of the inventive concepts. FIG. 2 illustrates a flowchart of an operation of the NFC circuit according to embodiments of the inventive concepts.

Referring to FIGS. 1 and 2, an NFC system 1 capable of supporting NFC includes an NFC circuit 10 and an NFC tag 20. For example, the NFC tag 20 may be an NFC device including an NFC circuit having the same structure as the NFC circuit 10. The NFC circuit 10 may include an NFC chip, and the NFC chip may be embedded in an electronic device capable of supporting NFC.

The NFC system 1 may for example be implemented as a security system, a payment system, a transportation system, a reservation and ticketing system, a building access system, or an electronic device access system, or the like. The NFC circuit 10 and the NFC tag 20 may use a radio frequency signal to communicate data with each other. That is, the NFC system 1 may provide or enable wireless communication of information such as one or more commands and/or data between the NFC circuit 10 and the NFC tag 20 which are disposed sufficiently close to each other. When the NFC tag 20 is located in a communication range of the NFC circuit 10, it can be determined and understood that the NFC circuit 10 is close to the NFC tag 20.

The NFC circuit 10 may for example be implemented as a part of a wireless communication device or a portable electronic device. For example, the portable electronic device may be a laptop computer, a mobile terminal, a smart phone, a tablet personal computer (PC), a personal digital assistant (PDA), an enterprise digital assistant (EDA), a digital still camera, a digital video camera, a portable multimedia player, a personal navigation device or portable navigation device (PND), a handheld game console, a mobile Internet device (MID), or an e-book, or the like.

The NFC circuit 10 and the NFC tag 20 may be included in independent or separate devices, respectively. However, the NFC circuit 10 and the NFC tag 20 are not limited thereto, and may be mounted or coupled in another electronic apparatus such as for example a smart phone, a portable calculator, a PDA, a laptop computer, a desktop computer, a computer peripheral such as a printer, a portable audio or video player, a payment system, a ticketing system, and the like.

The NFC circuit 10 may operate according to the flowchart shown in FIG. 2. In operation S10, the NFC circuit 10 operates in a standby mode. The NFC circuit 10 when in the standby mode may perform a detection operation for detecting the NFC tag 20. The NFC circuit 10 in the standby mode may further perform a calibration operation before performing the detection operation. The calibration operation may refer to an operation for securing a reference for detecting a change in a phase of a detection signal as the NFC circuit 10 accesses the NFC tag 20 in the detection operation. This will be described later below with reference to FIG. 7.

In operation S20, the NFC circuit 10 determines whether the NFC tag 20 has reached a sufficient distance to perform wireless communication. When the NFC tag 20 has not reached a sufficient distance to perform wireless communication (No in S20), the standby mode may be maintained. For example, the NFC circuit 10 may determine that the NFC tag 20 has reached a sufficient distance to perform wireless communication when the NFC tag 20 is located within a communication range of the NFC circuit 10. In contrast, the NFC circuit 10 may determine that the NFC tag 20 has not reached a sufficient distance to perform wireless communication when the NFC tag 20 is located outside the communication range of the NFC circuit 10.

When the NFC tag 20 has reached a sufficient distance to perform wireless communication (Yes in S20), the NFC circuit 10 in operation S30 performs or enters the reader mode. In the reader mode, the NFC circuit 10 may perform wireless communication of information about commands and/or data with the NFC tag 20.

While the NFC circuit 10 performs the wireless communication of information in the reader mode, the NFC circuit 10 may operate with an operating current of a certain magnitude or more. On the other hand, since an operation of detecting the NFC tag 20 is performed in the standby mode, the NFC circuit 10 may operate with a relatively less operating current during the detection operation. Power consumption in the reader mode of the NFC circuit 10 may be greater than power consumption in the standby mode. The NFC circuit 10 performs or functions in the standby mode instead of the reader mode in a situation where the NFC tag 20 has not reached a sufficient distance close enough to the NFC circuit 10 to prevent unnecessary power consumption.

Referring to FIG. 1, the NFC circuit 10 includes a tag detector 100, a clock (clk) recovery circuit 200, a controller 300, a transmitter 400, a matching network 500 and an antenna 600. The tag detector 100 includes a phase detector 110 and an analog-to-digital converter (ADC) 120.

The tag detector 100, in the standby mode, may output an output signal D_out corresponding to a distance between the NFC circuit 10 and the NFC tag 20. In an embodiment, the tag detector 100, in the standby mode, may output the output signal D_out having a value corresponding to a phase change of a recovered clock signal CLK_rec received from the clock recovery circuit 200. Since a phase of the recovered clock signal CLK_rec varies according to the distance between the NFC tag 20 and the NFC circuit 10, the output signal D_out may include information about (or indicative of) the distance between the NFC circuit 10 and the NFC tag 20.

The phase detector 110 receives the recovered clock signal CLK_rec and detects a phase change of the recovered clock signal CLK_rec according to access of the NFC tag 20. In an embodiment, the phase detector 110 may detect the phase change of the recovered clock signal CLK_rec through comparison with a reference clock signal CLK_ref.

The reference clock signal CLK_ref is a signal having a constant pulse width and a constant period, and may be constant without changing phase according to whether or not access of the NFC tag 20 has occurred. The reference clock signal CLK_ref may be generated by a clock signal generator (not shown) included in the NFC circuit 10. However, the inventive concepts are not limited thereto, and the reference clock signal CLK_ref may be provided from outside of the NFC circuit 10. In an embodiment, the recovered clock signal CLK_rec and the reference clock signal CLK_ref may have the same frequency.

The phase detector 110 outputs an output voltage V_out having a magnitude corresponding to the phase change of the recovered clock signal CLK_rec. The analog-to-digital converter 120 outputs the output signal D_out obtained by converting the output voltage V_out into a digital signal.

The clock recovery circuit 200, in the standby mode, may recover the recovered clock signal CLK_rec from a detection signal DS received via the antenna 600. The detection signal DS is a signal returned from the NFC tag 20 through antenna 600 according (responsive) to a transmission signal TS transmitted from the NFC circuit 10. The detection signal DS includes information about the NFC tag 20. The transmission signal TS may be a clock-embedded signal, and the detection signal DS may be a clock-embedded signal. As the NFC tag 20 accesses the NFC circuit 10, the impedance of the antenna 600 of the NFC circuit 10 may be changed. Accordingly, as the NFC tag 20 accesses the NFC circuit 10, a magnitude and/or a phase of the detection signal DS may change and the phase of the recovered clock signal CLK_rec may change to correspond to a phase change of the detection signal DS.

The controller 300 of the NFC circuit 10 may control the operation of other components to operate in the standby mode or the reader mode. The controller 300, in the standby mode, may control the transmitter 400 to generate a radio frequency (RF) field in order to detect and activate the NFC tag 20. For example, the controller 300, in the standby mode, may send a control signal CS to the transmitter 400 to initiate detecting of the NFC tag 20. That is, the transmitter 400, responsive to the control signal CS, may generate and transmit the RF field, so that the NFC circuit 10 may in turn detect detection signal DS. An RF field may be generated by the transmitter 400 by, for example, transmitting pulses with a pulse width of a constant magnitude.

The controller 300, in the standby mode, may receive the output signal D_out from the tag detector 100 and may determine whether to switch to the reader mode based on the output signal D_out. In an embodiment, the controller 300 may compare the output signal D_out with a reference value (e.g., D_ref in FIG. 7), and may determine that a distance from the NFC circuit 10 to the NFC tag 20 is close enough to perform data communication based on a result of the comparing. When the controller 300 determines that the NFC tag 20 is sufficiently close, the controller 300 may switch from the standby mode to the reader mode. Alternatively, the controller 300, in the reader mode, may receive the output signal D_out from the tag detector 100 and may determine whether to switch to the standby mode based on the output signal D_out.

The controller 300, in the reader mode, may perform wireless communication of information about commands and/or data with the NFC tag 20. The controller 300 may control the transmitter 400 to generate the RF field that includes the information about commands and/or data for wireless communication of the information.

The transmitter 400 may, in the standby mode according to the control signal CS provided by the controller 300, provide the transmission signal TS to the antenna 600, so that the NFC circuit 10 may then detect the NFC tag 20. Here, the transmitter 400 may receive the reference clock signal CLK_ref and output the transmission signal TS having a frequency (e.g., 13.56 MHz) corresponding to a frequency of the reference clock signal CLK_ref. On the other hand, in the reader mode, the transmitter 400 may receive a signal including the information about commands and/or data from the controller 300, and may output a transmission signal including the information about commands and/or data.

The matching network 500 performs impedance matching. For example, the matching network 500 may adjust impedance viewed from the matching network 500 to control output power to be high efficiency or high output power. The matching network 500 may for example include at least one of a capacitor and an inductor. The controller 300 may perform the impedance matching by controlling a connection relationship of at least one of the capacitor and the inductor that constitute the matching network 500. An exemplary configuration of the transmitter 400, the matching network 500, and the antenna 600 will be described later hereinafter with reference to FIG. 4.

In the reader mode, the NFC tag 20 may receive an RF signal including data output from the NFC circuit 10. The NFC tag 20 may analyze the RF signal output from the NFC circuit 10, generate data corresponding to a result of the analyzing, and through the antenna 21 output the generated data to the antenna 600 of the NFC circuit 10. The NFC circuit 10 may receive the data and store the data in a memory.

The NFC circuit 10 according to embodiments of the inventive concepts may detect the NFC tag 20 through the phase change of the detection signal DS. When access of the NFC tag 20 is instead detected by using the magnitude of a signal, there occurs a problem that the magnitude of the signal is reduced due to a configuration inside the NFC circuit 10 and detection performance is deteriorated. However, the NFC circuit 10 according to embodiments of the inventive concepts uses the phase change, so that the access of the NFC tag 20 may be detected without being affected by signal magnitude reduction. Further, the smaller the magnitude of power supplied from the NFC circuit 10 to the transmitter 400, the greater the phase change of the detection signal DS according to the distance between the NFC circuit 10 and the NFC tag 20. Therefore, the NFC circuit 10 may improve detection performance of the NFC tag 20 while reducing power consumption in the standby mode.

Figure 3:
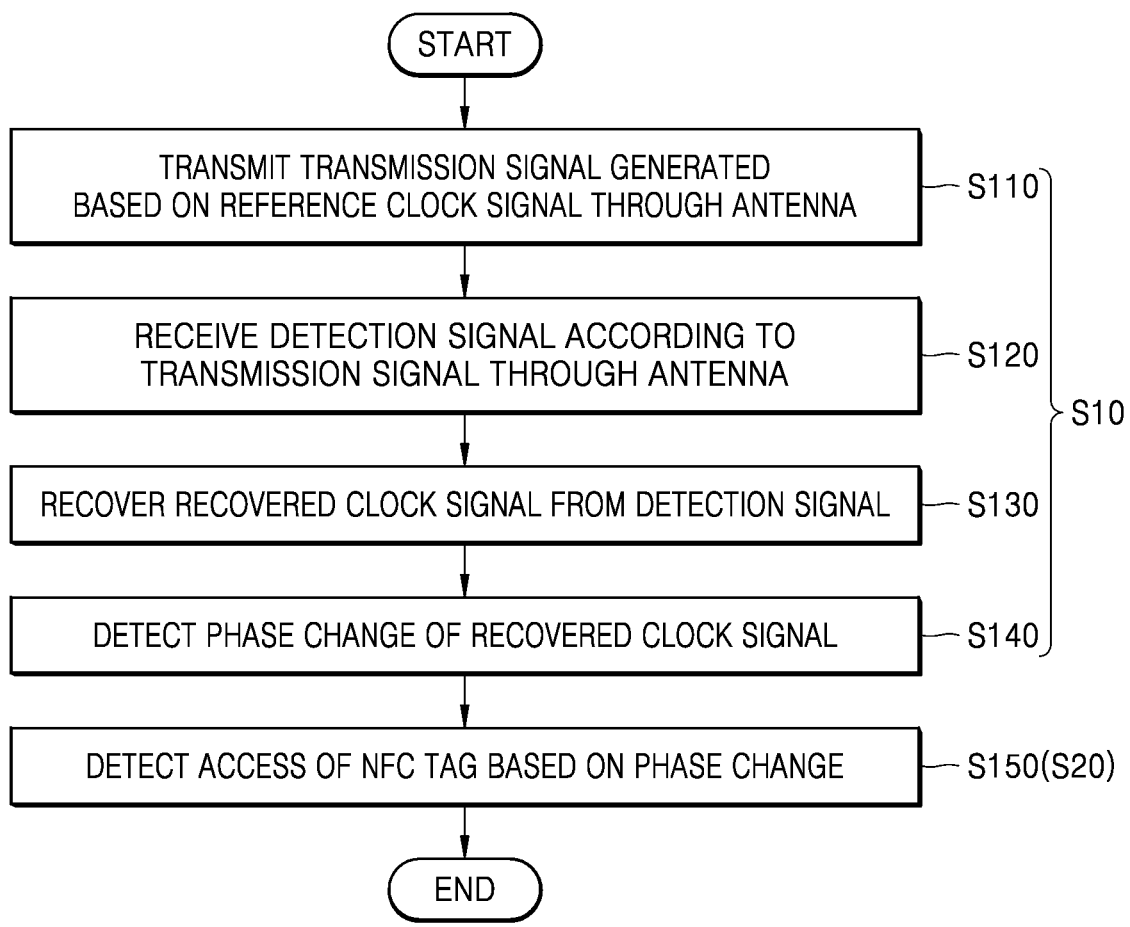
FIG. 3 illustrates a flowchart of an operation of an NFC circuit according to embodiments of the inventive concepts.

FIG. 3 illustrates a flowchart of an operation of an NFC circuit according to embodiments of the inventive concepts. FIG. 3 illustrates a detection operation for detecting an NFC tag 20 of the NFC circuit 10 in a standby mode (operation S10 of FIG. 2) and an operation for detecting access while in the standby mode (operation S20 of FIG. 2).

Referring to FIGS. 1 and 3, in operation S110, the NFC circuit 10 transmits the transmission signal TS through the antenna 600 to initiate detection of the NFC tag 20. This may be responsive to control signal CS provided from the controller 300. The transmission signal TS may be generated based on the reference clock signal CLK_ref. A frequency of the transmission signal TS may be the same as a frequency of the reference clock signal CLK_ref.

In operation S120, the NFC circuit 10 receives the detection signal DS according to the transmission signal TS through the antenna 600. As the NFC tag 20 accesses the NFC circuit 10, the impedance of the antenna 600 of the NFC circuit 10 may be changed. Therefore, when the NFC tag 20 accesses the NFC circuit 10, the magnitude and/or phase of the detection signal DS may be changed. The transmission signal TS and the detection signal DS may have the same frequency.

In operation S130, the NFC circuit 10 (e.g., clock recovery circuit 200) recovers the recovered clock signal CLK_rec from the detection signal DS. The recovered clock signal CLK_rec may include information about the phase change of the detection signal DS as the NFC tag 20 accesses the NFC circuit 10.

In operation S140, the NFC circuit 10 (e.g., tag detector 100) detects the phase change of the recovered clock signal CLK_rec. In an embodiment, on the basis of the phase of the recovered clock signal CLK_rec when the NFC tag 20 does not access the NFC circuit 10, that is on the basis of the phase of the recovered clock signal when the NFC tag 20 is located outside the communication range of the NFC circuit 10, the NFC circuit 10 may detect the phase change of the recovered clock signal CLK_rec when the NFC tag 20 accesses the NFC circuit 10. In an embodiment, the NFC circuit 10 may detect the phase change of the recovered clock signal CLK_rec by comparing the phase of the recovered clock signal CLK_rec to that of the reference clock signal CLK_ref. In an embodiment, the NFC circuit 10 may compare a phase of a delayed clock signal obtained by delaying the phase of the recovered clock signal CLK_rec by a calibration phase, with the phase of the reference clock signal CLK_ref, to detect the phase change of the recovered clock signal CLK_rec. Operations S110, S120, S130 and S140 in FIG. 3 may be characterized as corresponding to operation S10 of FIG. 2.

In operation S150, the NFC circuit may detect access of the NFC tag 20 based on the phase change of the recovered clock signal CLK_rec. That is, the NFC circuit 10 may detect whether the distance from the NFC circuit 10 to the NFC tag 20 is close enough to perform wireless communication. For example, the NFC circuit 10 and the NFC tag 20 may be capable of performing wireless communication to transmit and receive data within a distance of 10 cm or less. Operation S150 in FIG. 3 may be characterized as corresponding to operation S20 of FIG. 2.

The NFC circuit 10 according to the inventive concepts may detect the NFC tag 20 through the phase change of the recovered clock signal CLK_rec extracted from the detection signal DS. Even if consumption power in the standby mode is reduced, the NFC circuit 10 may detect the NFC tag 20 by detecting a phase change of the recovered clock signal CLK_rec that varies according to the access of the NFC tag 20, instead of by detecting a magnitude of the detection signal DS.

Figure 4:
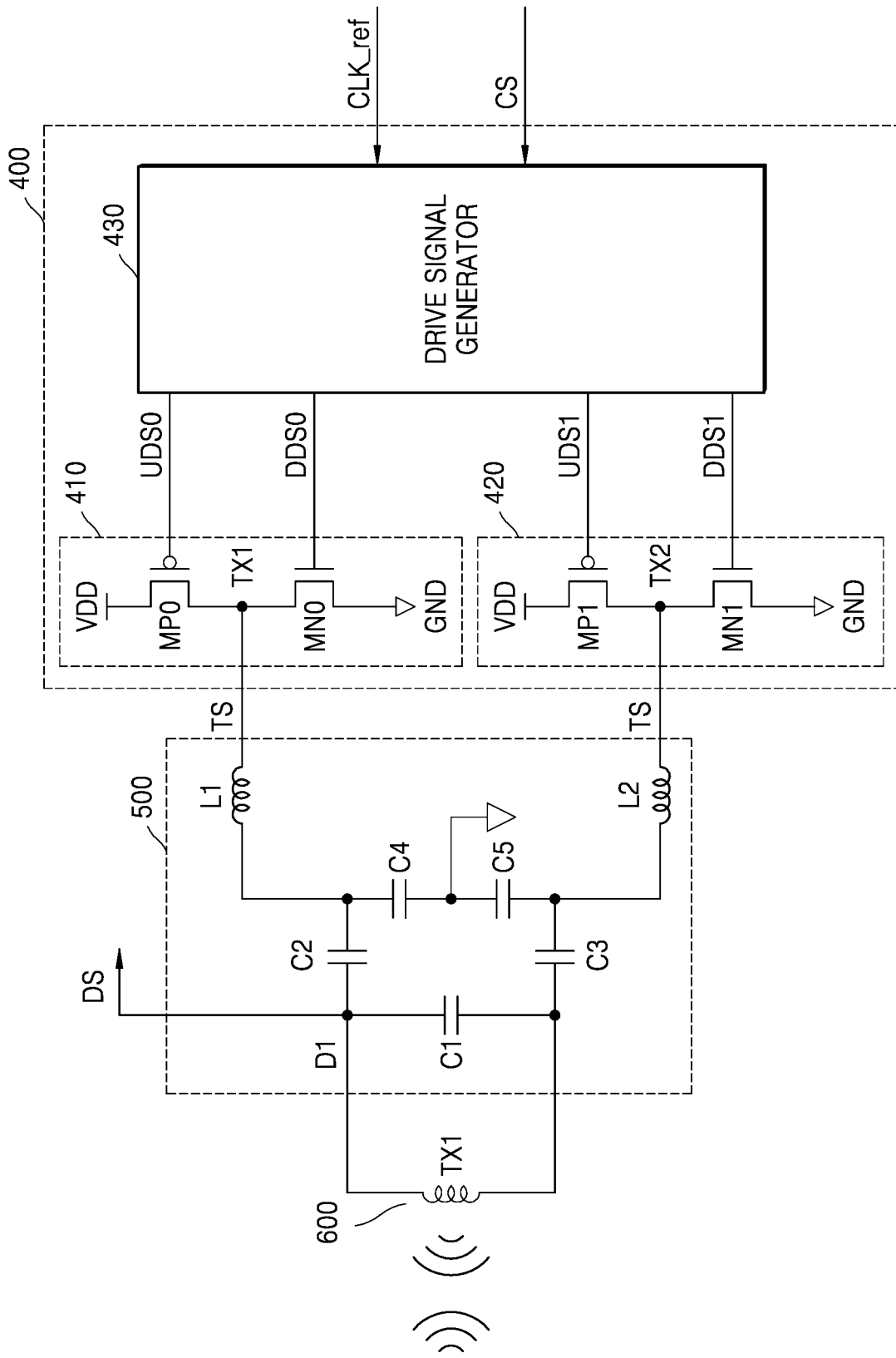
FIG. 4 illustrates a block diagram of a transmitter, a matching network, and an antenna included in an NFC circuit according to embodiments of the inventive concepts.

FIG. 4 illustrates a block diagram of a transmitter, a matching network, and an antenna included in an NFC circuit according to embodiments of the inventive concepts.

Referring to FIGS. 1 and 4, the transmitter 400 includes a first driver 410, a second driver 420, and a drive signal generator 430. The transmitter 400 may receive the control signal CS for initiating detecting the NFC tag 20 from the controller 300 and may receive the reference clock signal CLK_ref, and may output the transmission signal TS for detection of the NFC tag.

The first driver 410 includes a first pull-up transistor MP0 and a first pull-down transistor MN0, and the second driver 420 includes a second pull-up transistor MP1 and a second pull-down transistor MN1. The first pull-up transistor MP0 and the second pull-up transistor MP1 may be p-channel metal oxide semiconductor (PMOS) transistors, and the first pull-down transistor MN0 and the second pull-down transistor MN1 may be n-channel metal oxide semiconductor (NMOS) transistors.

The first pull-up transistor MP0 is connected between a transmission power supply voltage VDD and a first transmission terminal TX1, and the first pull-down transistor MN0 is connected between the first transmission terminal TX1 and a ground voltage GND. The second pull-up transistor MP1 is connected between the transmission power supply voltage VDD and a second transmission terminal TX2, and the second pull-down transistor MN1 is connected between the second transmission terminal TX2 and the ground voltage GND. However, configurations of the first driver 410 and the second driver 420 are not limited to those shown in FIG. 4 and may vary.

The drive signal generator 430 may drive the first pull-up transistor MP0 with a first pull-up drive signal UDS0, drive the first pull-down transistor MN0 with a first pull-down drive signal DDS0, drive the second pull-up transistor MP1 with a second pull-up drive signal UDS1, and drive the second pull-down transistor MN1 with a second pull-down drive signal DDS1.

The drive signal generator 430 may perform an operation to detect the NFC tag 20 in response to the control signal CS provided from the controller 300. That is, the transmitter 400 may transmit the transmission signal TS to initiate detection of the NFC tag 20. The drive signal generator 430 may generate the first pull-up drive signal UDS0, the first pull-down drive signal DDS0, the second pull-up drive signal UDS1, and the second pull-up drive signal DDS1 using the reference clock signal CLK_ref in the standby mode. Therefore, the transmission signal TS output from the first transmission terminal TX1 and the second transmission terminal TX2 may have the same frequency as that of the reference clock signal CLK_ref.

The matching network 500 performs impedance matching between the antenna 600 and the transmitter 400. The matching network 500 includes a plurality of capacitors C1, C2, C3, C4 and C5 and a plurality of inductors L1 and L2. It should be understood that the configuration of the matching network 500 is an example embodiment, and that the matching network 500 may be implemented in various configurations for impedance matching and should not be limited to the configuration shown in FIG. 4.

The antenna 600 may operate as a dedicated loop antenna for NFC. The antenna 600 may function as an inductor LA having a certain inductance. The antenna 600 as shown is connected in parallel with a first capacitor C1 of the matching network 500. Accordingly, the antenna 600, together with the first capacitor C1, may operate as a resonator having a resonance frequency suitable for NFC.

A detection terminal D1, which is at a first end of the antenna 600 that is connected to the first capacitor C1, is connected to the clock recovery circuit 200. The clock recovery circuit 200 may receive the detection signal DS from the detection terminal D1 and may generate the recovered clock signal CLK_rec.

Figure 5:
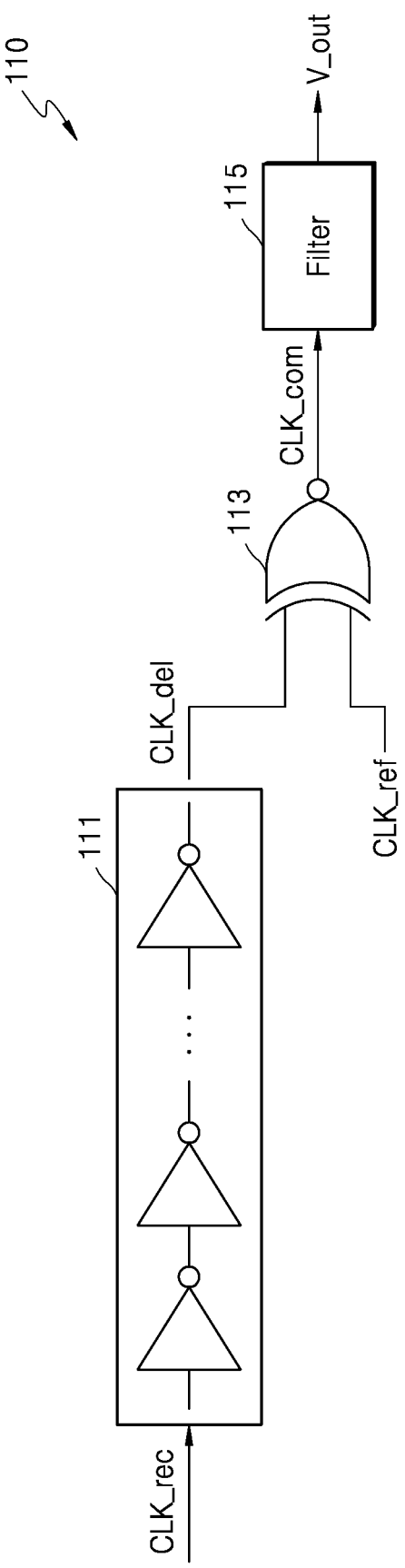
FIG. 5 illustrates a block diagram of a phase detector included in an NFC circuit according to embodiments of the inventive concepts.

FIG. 5 illustrates a block diagram of a phase detector included in an NFC circuit according to embodiments of the inventive concepts.

Referring to FIGS. 1 and 5, the phase detector 110 includes a clock delay circuit 111, a phase comparator 113, and a filter 115.

The clock delay circuit 111 may receive the recovered clock signal CLK_rec from the clock recovery circuit 200 and move the phase of the recovered clock signal CLK_rec by a calibration phase. That is, the clock delay circuit 111 may generate a delayed clock signal CLK_del shifted in phase by the calibration phase from the recovered clock signal CLK_rec.

In an embodiment, the clock delay circuit 111 may include delay cells, and each of the delay cells may shift the phase of the recovered clock signal CLK_rec. Each of the delay cells may for example be implemented with an inverter, and the degree of phase shift of the recovered clock signal CLK_rec may vary according to the number of inverters connected each other.

The calibration phase may be determined by an internal circuit configuration of the NFC circuit 10. In an embodiment, the calibration phase may be a phase difference between the recovered clock signal CLK_rec and the reference clock signal CLK_ref when the NFC circuit 10 is in a state of not accessing the NFC circuit 10, that is, when the NFC tag 20 is located outside the communication range of the NFC circuit 10. That is, the clock delay circuit 111 may delay the phase of the recovered clock signal CLK_rec when the NFC tag 20 does not access the NFC circuit 10, to coincide with a phase of the reference clock signal CLK_ref.

The calibration phase may be determined by the internal circuit configuration of the NFC circuit 10. Referring to the matching network 500 and the antenna 600 of FIG. 4, a phase difference may occur between the recovered clock signal CLK_rec and the reference clock signal CLK_ref by the matching network 500 and the antenna 600.

The NFC circuit 10 according to the inventive concepts detects a phase change based on the phase of the reference clock signal CLK_ref in order to detect the phase change of the recovered clock signal CLK_rec as the NFC tag 20 accesses the NFC circuit 10. Therefore, detection of the phase change may be made easy and accurate.

The phase comparator 113 outputs a phase difference signal CLK_com by comparing the phase of the delayed clock signal CLK_del to that of the reference clock signal CLK_ref. In an embodiment, a phase difference between the delayed clock signal CLK_del and the reference clock signal CLK_ref may be obtained using an exclusive NOR (XNOR) gate. A pulse width of the phase difference signal CLK_com may correspond to the phase difference between the delayed clock signal CLK_del and the reference clock signal CLK_ref. However, the phase comparator 113 may be implemented by a NOR gate or may be implemented in various ways, unlike as illustrated in the inventive concept.

The filter 115 may output the output voltage V_out having a different magnitude according to the pulse width of the phase difference signal CLK_com. The filter 115 may for example include a low pass filter. In an embodiment, the filter 115 may include a resistor and a capacitor.

The filter 115 may output the output voltage V_out proportional to a frequency and the pulse width of the received phase difference signal CLK_com. Since the pulse width of the phase difference signal CLK_com corresponds to the phase difference between the delayed clock signal CLK_del and the reference clock signal CLK_ref, the output voltage V_out may include information about the phase change of the recovered clock signal CLK_rec. The output voltage V_out may be converted by the analog-to-digital converter 120 into the output signal D_out, which is a digital signal.

Figure 6A:
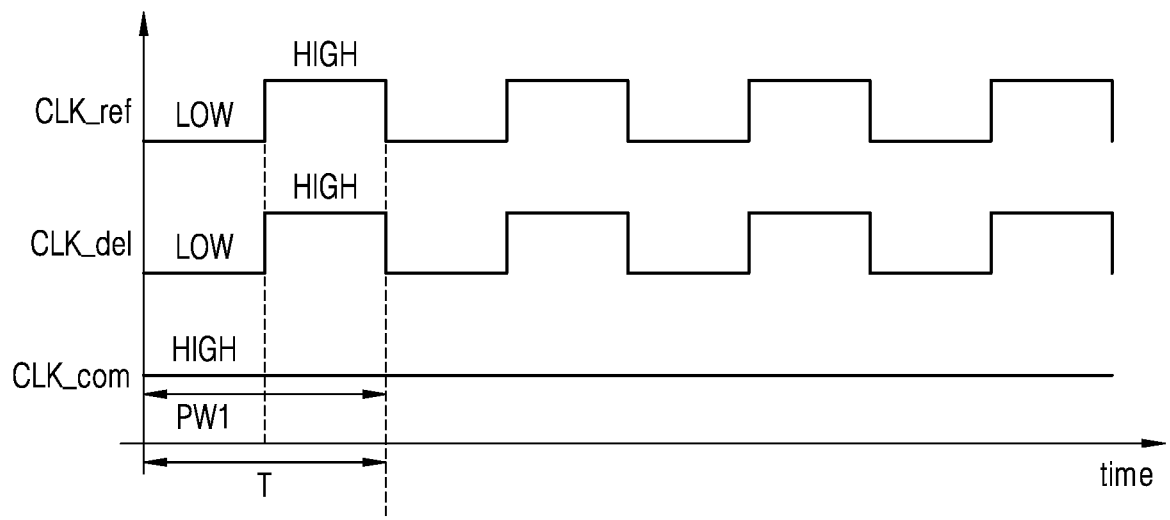
FIG. 6A illustrates timing diagrams of operation of the phase detector of FIG. 5, when the NFC tag does not access the NFC circuit.
Figure 6B:
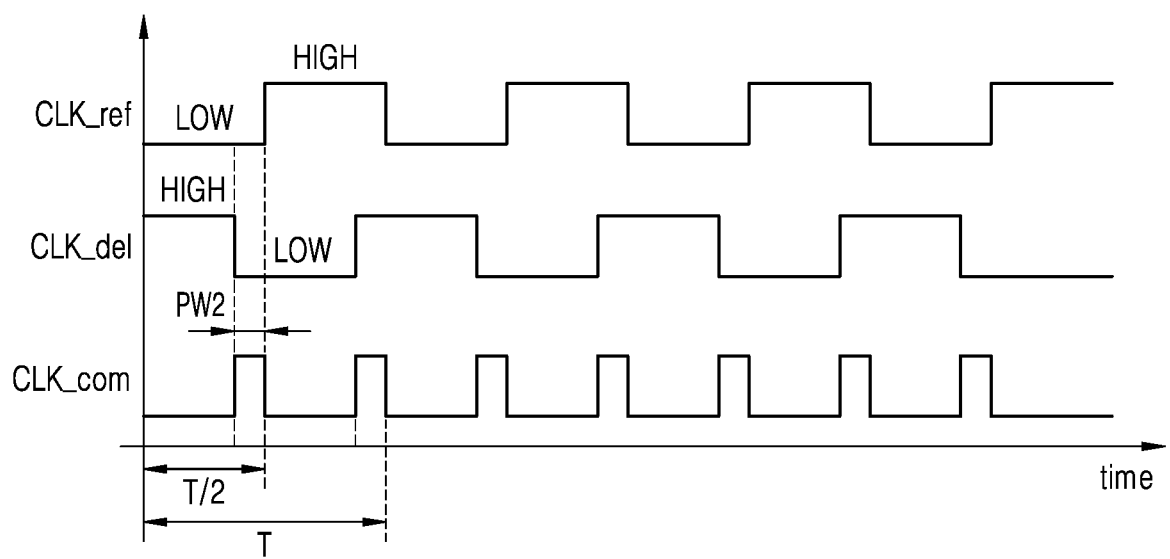
FIG. 6B illustrates timing diagrams of operation of the phase detector of FIG. 5, when the NFC tag accesses the NFC circuit.

FIGS. 6A and 6B illustrate timing diagrams of operation of the phase detector 110 of FIG. 5. FIG. 6A is a timing diagram of clock signals when an NFC tag does not access an NFC circuit, and FIG. 6B shows clock signals when the NFC tag accesses the NFC circuit.

Referring to FIGS. 5 and 6A, when the NFC tag does not access the NFC circuit, the phase of the reference clock signal CLK_ref and a phase of the delayed clock signal CLK_del coincide with each other because of the clock delay circuit 111. Thus, the phase difference signal CLK_com may be a signal having a first logic level (e.g., a high level).

Referring to FIGS. 5 and 6B, when the NFC tag accesses the NFC circuit, the phase of the recovered clock signal CLK_rec may change. Due to the phase change of the recovered clock signal CLK_rec, the phase of the delayed clock signal CLK_del shifted in phase by the calibration phase from the recovered clock signal CLK_rec may be different from the phase of the reference clock signal CLK_ref.

The phase difference signal CLK_com may be a pulse signal having a constant pulse width PW2. For example, the phase difference signal CLK_com may have a first logic level (e.g., a high level) when the reference clock signal CLK_ref and the delayed clock signal CLK_del have the same logic level, and may have a second logic level (e.g., a low level) when the logic level of the clock signal CLK_del is different from the logic level of the delayed clock signal CLK_del. Therefore, a pulse width PW2 of the phase difference signal CLK_com in FIG. 6B may correspond to the phase difference between the reference clock signal CLK_ref and the delayed clock signal CLK_del, and may include information about a distance between the NFC tag and the NFC circuit.

A period T of the reference clock signal CLK_ref and a period T of the delayed clock signal CLK_del may be equal to each other. A period of the phase difference signal CLK_com may be generated to substantially have a value of half the period T of the reference clock signal CLK_ref.

Referring to FIGS. 5, 6A, and 6B, the filter 115 may output the output voltage V_out having a different magnitude according to the pulse width of the phase difference signal CLK_com. In an embodiment, the magnitude of the output voltage V_out may be proportional to a frequency of the phase difference signal CLK_com and pulse widths PW1 and PW2 of the phase difference signal CLK_com. The magnitude of the output voltage V_out of the filter 115 receiving the phase difference signal CLK_com of FIG. 6A may have a maximum value, and the magnitude of the output voltage V_out of the filter 115 receiving the phase difference signal CLK_com of FIG. 6B may be less than the maximum value.

FIG. 7 illustrates a graph of operations of the NFC circuit 10 according to example embodiments of the inventive concepts, and shows a change in an output signal received by a controller with time.

Referring to FIGS. 1, 5, and 7, the NFC circuit 10 may further perform a calibration operation before performing a detection operation in a standby mode. The detection operation of the NFC circuit 10 may include operations S110 to S150 of FIG. 3.

The calibration operation may be performed in a situation where the NFC tag 20 does not access the NFC circuit 10. The NFC circuit 10 may correct the occurrence of the phase difference between the reference clock signal CLK_ref and the recovered clock signal CLK_rec by using the internal circuit configuration of the NFC circuit 10. For example, the controller 300 may correct the occurrence of the phase difference between the reference clock signal CLK_ref and the recovered clock signal CLK_rec by controlling the degree of phase shift of the phase delay circuit 111. That is, the NFC circuit 10 may determine a calibration phase of the clock delay circuit 111.

As the calibration operation is performed, the phase of the reference clock signal CLK_ref and the phase of the delayed clock signal CLK_del may coincide with each other in a situation where the NFC tag 20 does not access the NFC circuit 10. When the phases of the reference clock signal CLK_ref and the delayed clock signal CLK_del coincide with each other, the output voltage V_out may reach a maximum value and the magnitude of the output signal D_out may reach a maximum value D_cal.

The NFC circuit 10 may perform the detection operation when the calibration operation is completed. When the NFC tag 20 does not access the NFC circuit 10, a first value D_out1, which is the magnitude of the output signal D_out, may maintain the maximum value D_cal, which is the magnitude of the output signal D_out when the calibration operation is completed.

When the NFC tag 20 accesses the NFC circuit 10, the phase of the recovered clock signal CLK_rec may change and the phase of the delayed clock signal CLK_del may also change. As the phase difference signal CLK_com changes, the magnitude of the output voltage V_out may be reduced. The controller 300 may receive the output signal D_out having a reduced second value D_out2 and may determine that the NFC tag 20 has accessed the NFC circuit 10 when the second value D_out2 is equal to or less than the reference value D_ref.

However, the NFC circuit 10 according to the inventive concepts is not limited thereto. When the phases of the reference clock signal CLK_ref and the delayed clock signal CLK_del coincide with each other, the tag detector 100 may be configured such that the magnitude of the output signal D_out has a minimum value. The controller 300 may determine that the NFC tag 20 has accessed the NFC circuit 10 when the magnitude of the output signal D_out is equal to or greater than the reference value D_ref.

Figure 8:
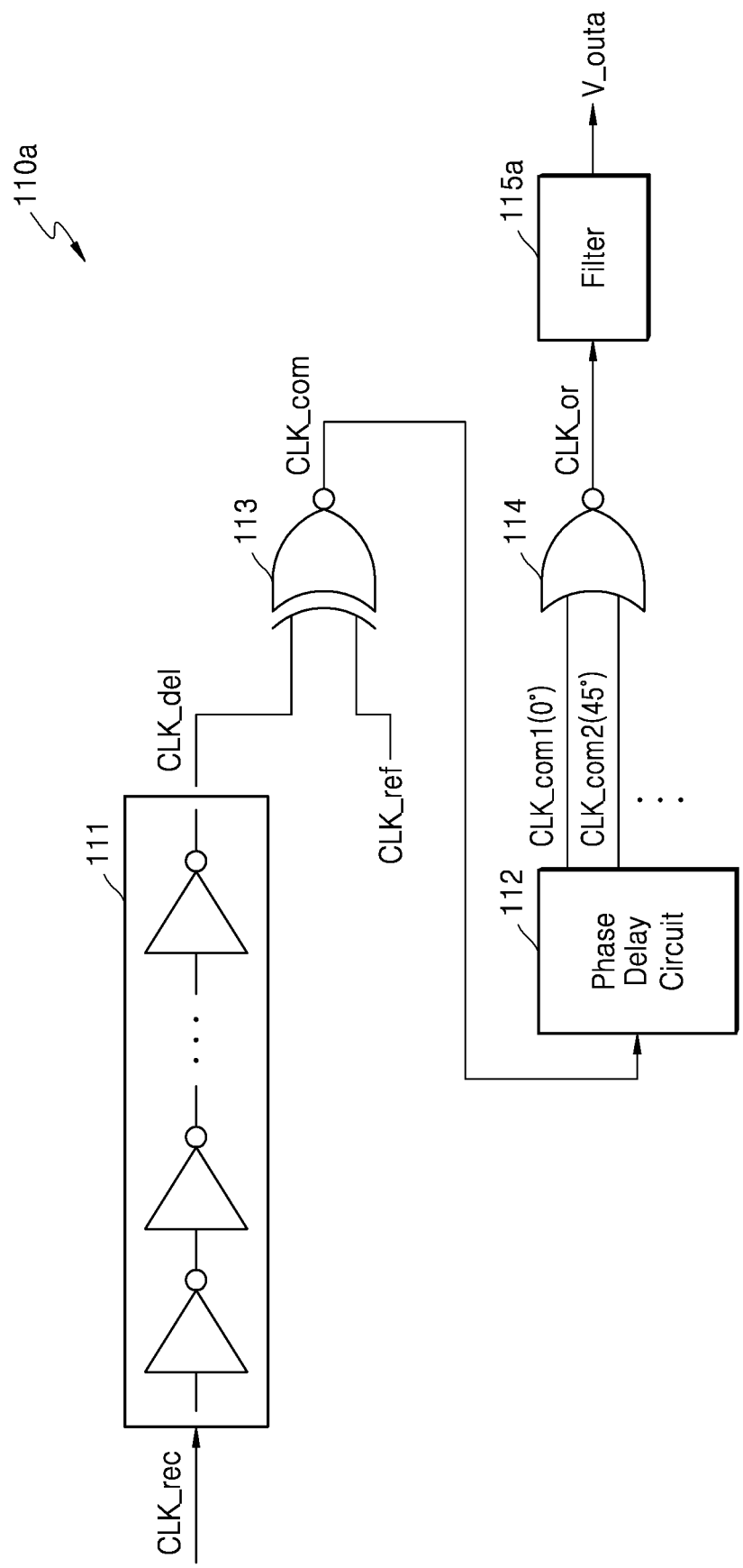
FIG. 8 illustrates a block diagram of a phase detector included in an NFC circuit according to embodiments of the inventive concepts.
Figure 9:
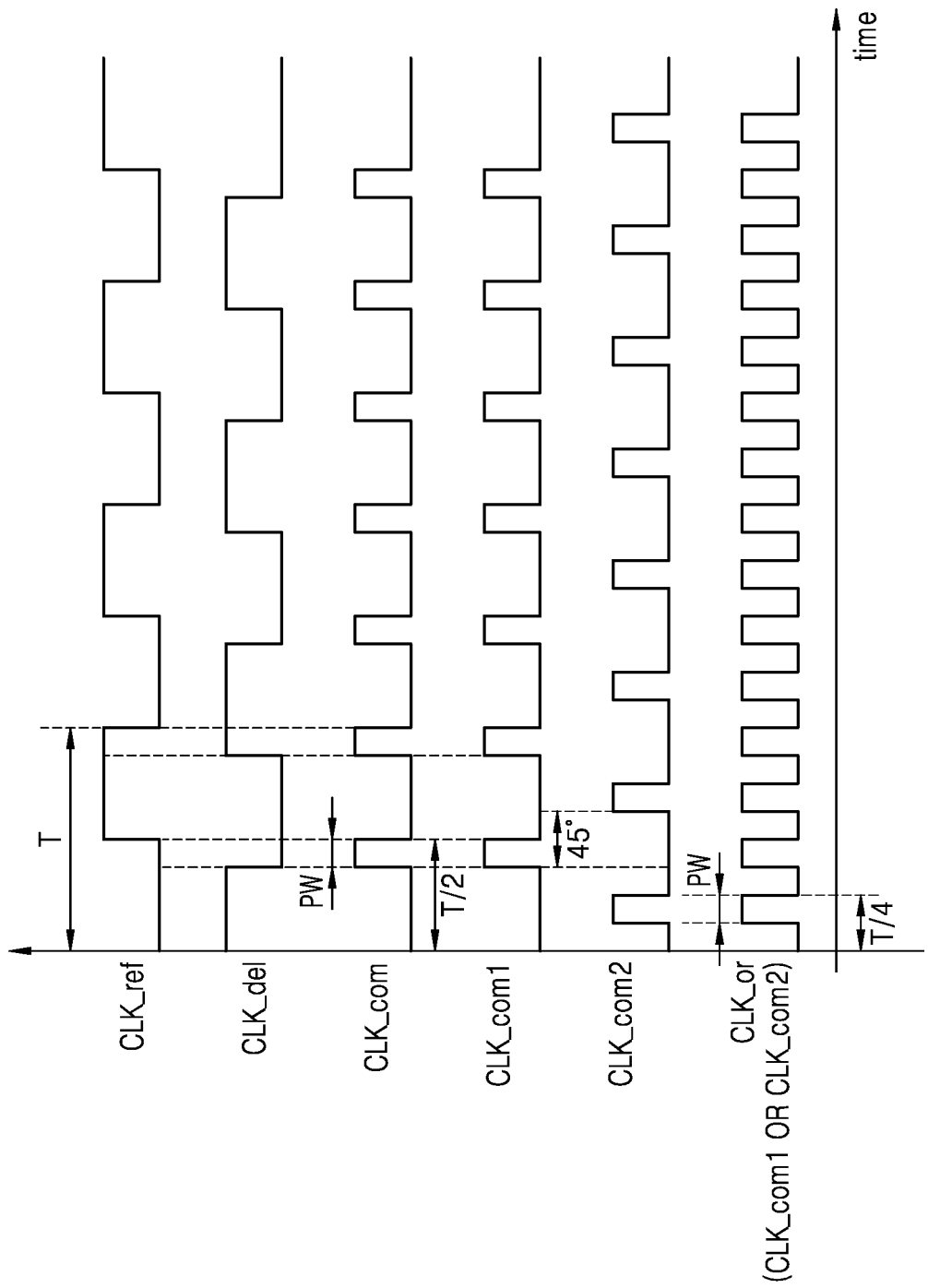
FIG. 9 illustrates a timing diagram of operation of the phase detector of FIG. 8.

FIG. 8 illustrates a block diagram of a phase detector included in an NFC circuit according to embodiments of the inventive concepts. FIG. 9 illustrates a timing diagram of an operation of the phase detector of FIG. 8. In FIG. 8, like reference numerals to those in FIG. 5 denote like elements, and repeated description of structure in FIG. 8 that is the same as in FIG. 5 may be omitted from the following.

Referring to FIGS. 8 and 9, phase detector 110a includes the clock delay circuit 111, the phase comparator 113, a phase delay circuit 112, a logic circuit 114, and the filter 115a.

The phase delay circuit 112 receives the phase difference signal CLK_com from the phase comparator 113 and outputs a plurality of signals delayed from 0 degrees to less than 180 degrees from the phase difference signal CLK_com. In an embodiment, the phase delay circuit 112 may output a first phase difference signal CLK_com1 delayed (shifted) by 0 degrees (i.e., a first phase shift) and a second phase difference signal CLK_com2 delayed (shifted) by 45 degrees (i.e., a second phase shift) from the phase difference signal CLK_com. Accordingly, the first phase difference signal CLK_com1 may have the same phase as that of the phase difference signal CLK_com. Here, the magnitude of a delayed phase may be a value calculated based on the period T of the reference clock signal CLK_ref, not a period T/2 of the phase difference signal CLK_com.

The phase delay circuit 112 may include a plurality of delay cells, and each of the plurality of delay cells may for example be implemented with an inverter. The phase delay circuit 112 may use the phase difference signal CLK_com to generate the first phase difference signal CLK_com1 and the second phase difference signal CLK_com2 using propagation delay of the plurality of delay cells. The first phase difference signal CLK_com1 and second phase difference signal CLK_com2 may be provided at output terminals of respective delay cells.

FIGS. 8 and 9 show that the phase delay circuit 112 outputs only the first phase difference signal CLK_com1 delayed by 0 degrees and the second phase difference signal CLK_com2 delayed by 45 degrees. However, the phase delay circuit 112 may further output a signal having a phase different from the first phase difference signal CLK_com1 and the second phase difference signal CLK_com2. For example, the phase delay circuit 112 may further output signals delayed by 90 degrees and 135 degrees from the phase difference signal CLK_com, respectively.

The logic circuit 114 may include an OR gate that receives the first phase difference signal CLK_com1 and the second phase difference signal CLK_com2, and performs an OR operation. When the phase delay circuit 112 further outputs signals other than the first phase difference signal CLK_com1 and the second phase difference signal CLK_com2, the logic circuit 114 may selectively receive signals from among the signals output from the phase delay circuit 112 and perform the OR operation.

The logic circuit 114 performs the OR operation on the first phase difference signal CLK_com1 and the second phase difference signal CLK_com2 to output a combination signal CLK_or. In an embodiment, the combination signal CLK_or may have a pulse width PW equal to that of the phase difference signal CLK_com, but may have a period T/4 that is substantially less than the period T/2 of the phase difference signal CLK_com. The pulse width PW of the combination signal CLK_or may be less than the period T/4 of the combination signal CLK_or.

The filter 115a outputs an output voltage V_outa proportional to a frequency and the pulse width PW of the received combination signal CLK_or. Therefore, compared to the filter 115 in FIG. 5 that receives the phase difference signal CLK_com to generate an output voltage V_out, the filter 115a in FIG. 8 outputs a high voltage when receiving the combination signal CLK_or with a substantially reduced period to generate the output voltage V_outa. That is, the phase detector 110a may provide an amplified output when converting a phase difference between the reference clock signal CLK_ref and the delayed clock signal CLK_del corresponding to a phase change of the recovered clock signal CLK_rec according to the access of the NFC tag into the output voltage V_outa.

The NFC circuit according to the inventive concepts may generate the amplified output voltage V_outa even when the magnitude of the phase change of the recovered clock signal CLK_rec is small by generating the combination signal CLK_or having period less than that of the phase difference signal CLK_com, thereby improving the detection performance of the NFC tag in a controller.

Figure 10:
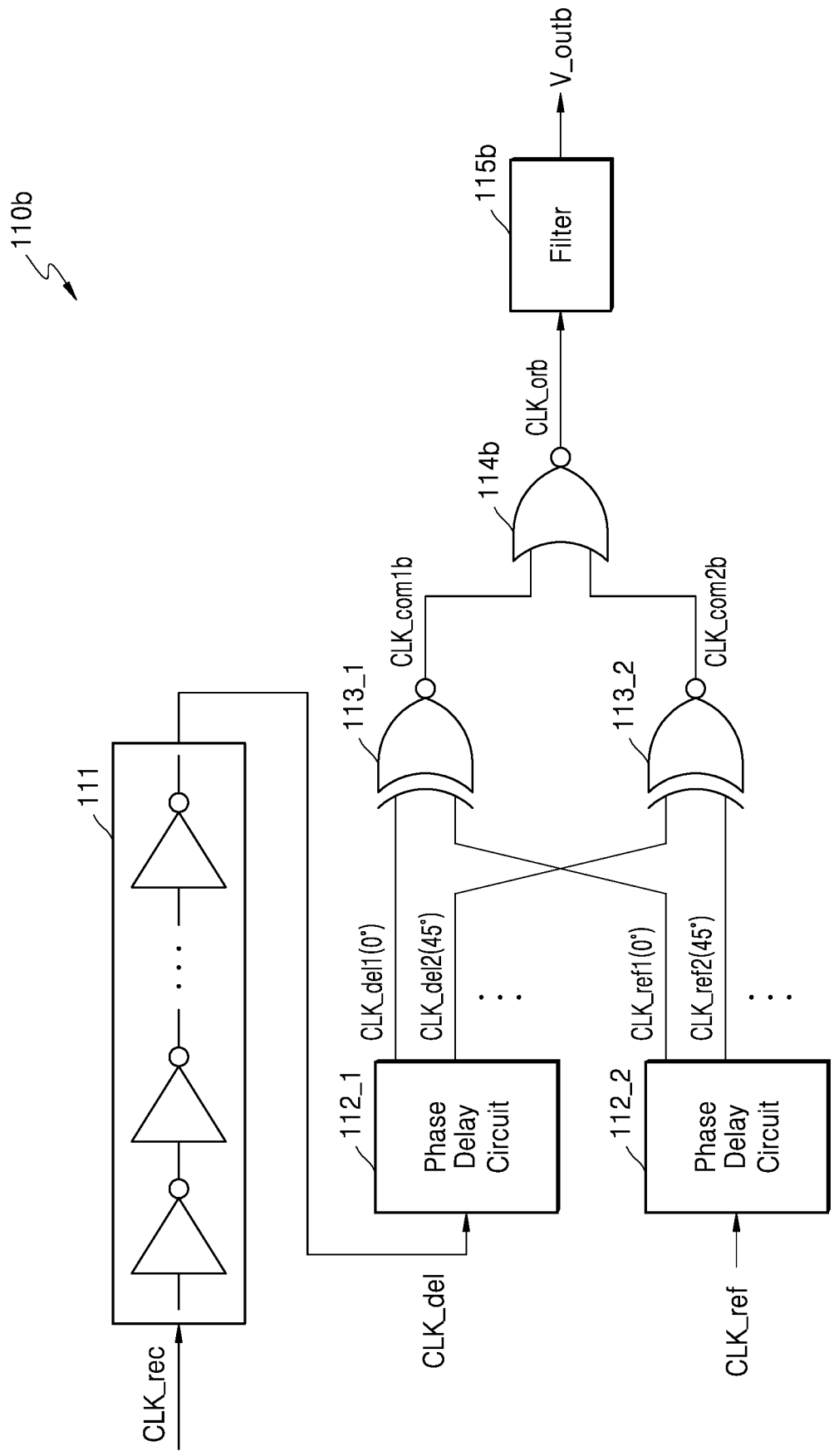
FIG. 10 illustrates a block diagram of a phase detector included in an NFC circuit according to embodiments of the inventive concepts.
Figure 11:
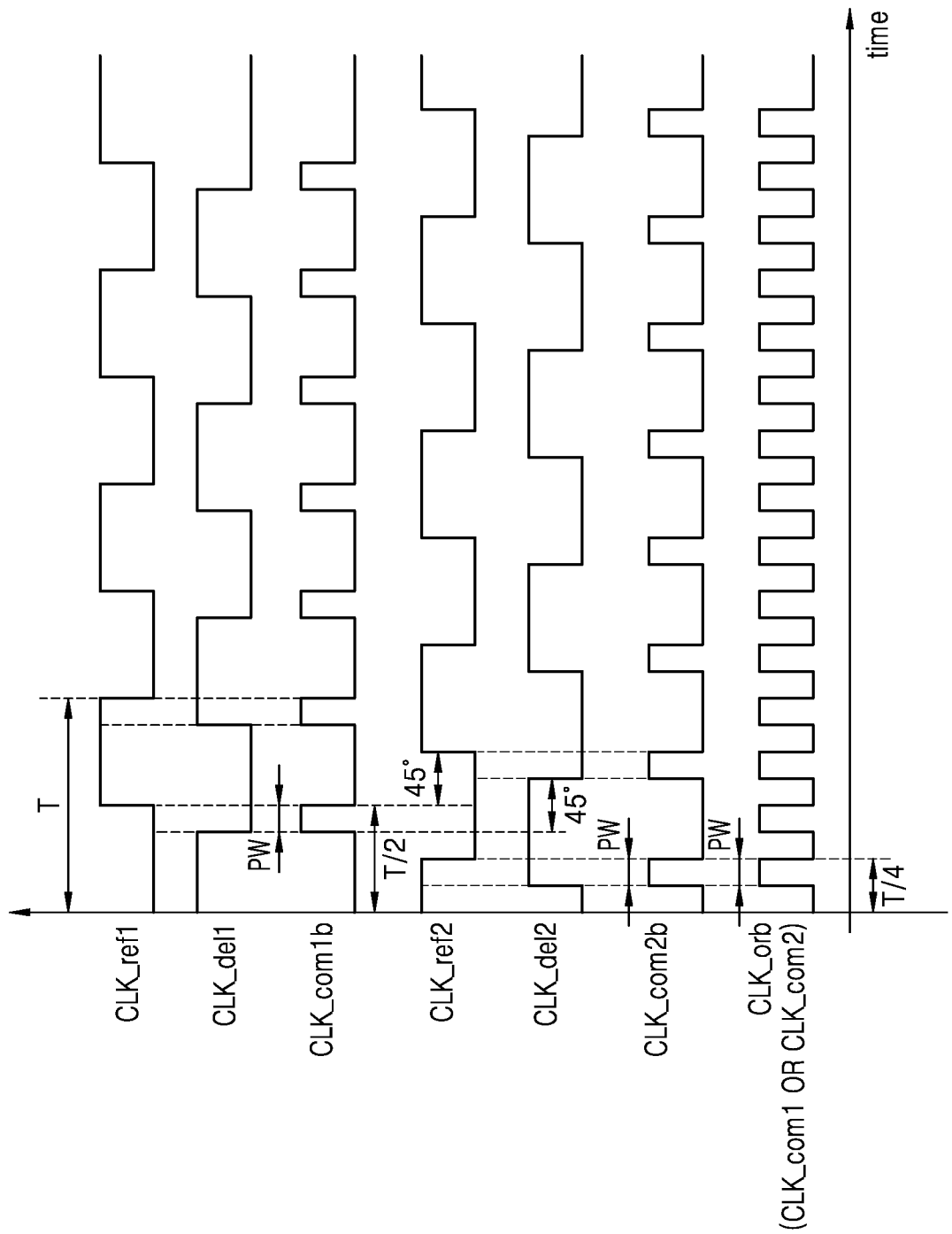
FIG. 11 illustrates a timing diagram of operation of the phase detector of FIG. 10.

FIG. 10 illustrates a block diagram of a phase detector included in an NFC circuit according to embodiments of the inventive concepts. FIG. 11 illustrates a timing diagram of an operation of the phase detector of FIG. 10. In FIG. 10, like reference numerals to those in FIG. 5 denote like elements, and repeated description of structure in FIG. 10 that is the same as in FIG. 5 may be omitted from the following.

Referring to FIGS. 10 and 11, phase detector 110b includes the clock delay circuit 111, a first phase delay circuit 112_1, a second phase delay circuit 112_2, a first phase comparator 113_1, a second phase comparator 113_2, a logic circuit 114b, and a filter 115b.

The first phase delay circuit 112_1 receives the delayed clock signal CLK_del from the clock delay circuit 111 and outputs a plurality of signals delayed from 0 degrees to less than 180 degrees from the delayed clock signal CLK_del. In an embodiment, the first phase delay circuit 112_1 may provide a first delayed clock signal CLK_del1 delayed (shifted) by 0 degrees (i.e., a first phase shift) and a second delayed clock signal CLK_del2 delayed by 45 degrees (i.e., a second phase shift) from the delayed clock signal CLK_del. The first delayed clock signal CLK_del1 may be substantially equal to the delayed clock signal CLK_del.

The second phase delay circuit 112_2 receives the reference clock signal CLK_ref and output signals delayed from 0 degrees to less than 180 degrees from the reference clock signal CLK_ref. In an embodiment, the second phase delay circuit 112_2 may provide a first reference clock signal CLK_ref1 delayed (shifted) by 0 degrees (i.e., the first phase shift) and a second reference clock signal CLK_ref2 delayed (shifted) by 45 degrees (i.e., the second phase shift) from the reference clock signal CLK_ref. The first reference clock signal CLK_ref1 may be substantially equal to the reference clock signal CLK_ref.

FIGS. 10 and 11 show that the first phase delay circuit 112_1 and the second phase delay circuit 112_2 output only the first delayed clock signals CLK_del1 and the first reference clock signal CLK_ref1 delayed by 0 degrees, and the second delayed clock signal CLK_del2 and the second reference clock signal CLK_ref2 delayed by 45 degrees, from the received signals CLK_del and CLK_ref, respectively. However, in embodiments of the inventive concepts the first phase delay circuit 112_1 and the second phase delay circuit 112_2 may further output a plurality of signals delayed from 0 degrees to less than 180 degrees from the received signals CLK_del and CLK_ref, respectively.

The first phase comparator 113_1 outputs a first phase difference signal CLK_com1b by comparing the phase of the first delayed clock signal CLK_del1 to that of the first reference clock signal CLK_ref1. In an embodiment, the phase difference between the first delayed clock signal CLK_del1 and the first reference clock signal CLK_ref1 may be obtained using an XNOR gate. Therefore, the pulse width PW of the first phase difference signal CLK_com1b may correspond to the phase difference between the first delayed clock signal CLK_del1 and the first reference clock signal CLK_ref1.

The second phase comparator 113_2 outputs a second phase difference signal CLK_com2b by comparing the phase of the second delayed clock signal CLK_del2 to that of the second reference clock signal CLK_ref2. In an embodiment, the phase difference between the second delayed clock signal CLK_del2 and the second reference clock signal CLK_ref2 may be obtained using an XNOR gate. Therefore, the pulse width PW of the second phase difference signal CLK_com2b may correspond to the phase difference between the second delayed clock signal CLK_del2 and the second reference clock signal CLK_ref2.

Since the second delayed clock signal CLK_del2 is delayed by 45 degrees from the first delayed clock signal CLK_del1, and the second reference clock signal CLK_ref2 is delayed by 45 degrees from the first reference clock signal CLK_ref1, the second phase difference signal CLK_com2b may be a signal substantially delayed 45 degrees from the first delayed clock signal CLK_del1. Here, the magnitude of a delayed phase may be a value calculated based on the period T of the reference clock signal CLK_ref, not the period T/2 of the first phase difference signal CLK_com1b. Therefore, the pulse width PW of the second delayed clock signal CLK_del2 may be equal to the pulse width PW of the first phase difference signal CLK_com1b.

FIGS. 10 and 11 show only first phase comparator 113_1 and second phase comparator 113_2 (i.e., two phase comparators), but the phase detector 110b may further include at least one additional phase comparator. The at least one additional phase comparator may respectively receive signals from the first phase delay circuit 112_1 and the second phase delay circuit 112_2 to compare the phases and provide a result of the comparing to the logic circuit 114b.

The logic circuit 114b receives the first phase difference signal CLK_com1b and the second phase difference signal CLK_com2b and perform the OR operation to output a combination signal CLK_orb. In an embodiment, the combination signal CLK_orb may have the pulse width PW equal to that of the first phase difference signal CLK_com1b, but may have the period T/4 that is substantially less than the period T/2 of the first phase difference signal CLK_com1b. The pulse width PW of the combination signal CLK_orb may be less than the period T/4 of the combination signal CLK_orb.

The filter 115b may output an output voltage V_outb proportional to a frequency and the pulse width PW of the received combination signal CLK_orb. Therefore, compared to the filter 115 in FIG. 5 that receives the phase difference signal CLK_com to generate an output voltage Vout, the filter 115b outputs a high voltage when receiving the combination signal CLK_orb with a substantially reduced period to generate the output voltage V_outb. That is, the phase detector 110b may provide an amplified output when converting the phase difference between the reference clock signal CLK_ref and the delayed clock signal CLK_del corresponding to a phase change of the recovered clock signal CLK_rec according to the access of the NFC tag into the output voltage V_outb.

The NFC circuit according to the inventive concepts may generate the amplified output voltage V_outb even when the magnitude of the phase change of the recovered clock signal CLK_rec is small by generating the combination signal CLK_orb having the same pulse width as that of the first phase difference signal CLK_com1b, but with a reduced period, thereby improving the detection performance of the NFC tag in the controller.

Figure 12:
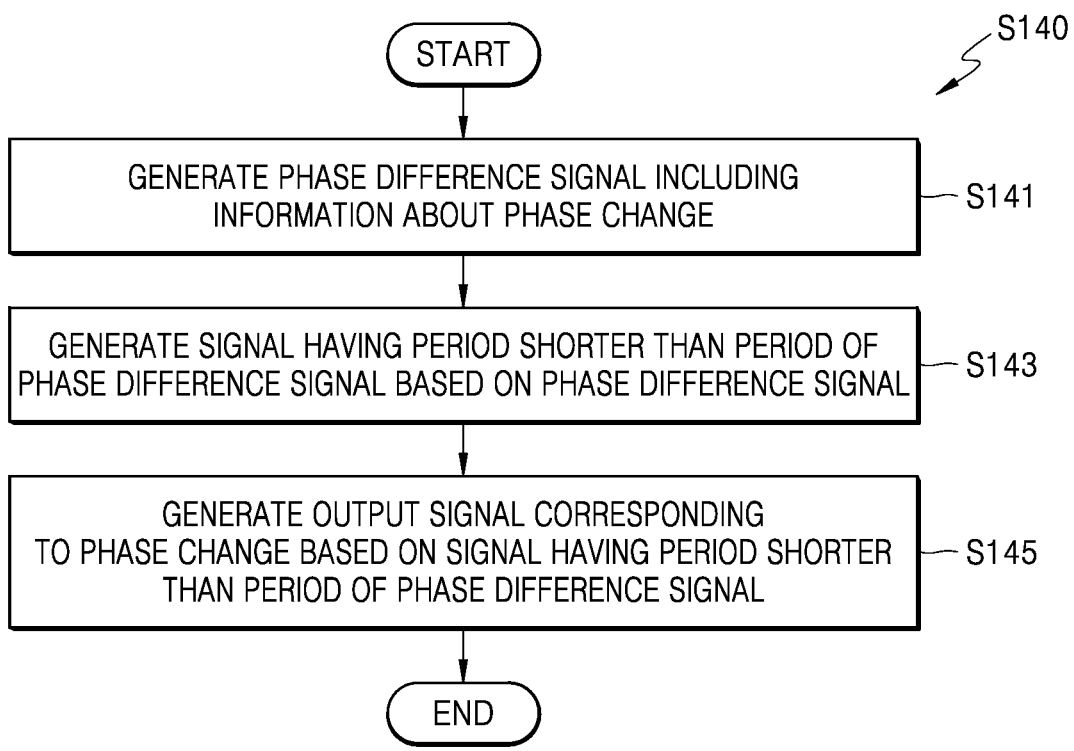
FIG. 12 illustrates a flowchart of an operation of an NFC circuit according to embodiments of the inventive concepts.

FIG. 12 illustrates a flowchart of an operation of the NFC circuit 10 according to embodiments of the inventive concepts. FIG. 12 illustrates a flowchart for explaining operation S140 of FIG. 3.

Referring to FIGS. 1 and 12, in operation S141, the NFC circuit 10 generates a phase difference signal including information about the phase change of the recovered clock signal CLK_rec. In an embodiment, on the basis of the phase of the recovered clock signal CLK_rec when the NFC tag 20 does not access the NFC circuit 10, the NFC circuit 10 may detect the phase change of the recovered clock signal CLK_rec when the NFC tag 20 accesses. For example, as shown in FIGS. 8 and 10, the phase detectors 100a and 100b may generate the phase difference signals CLK_com and CLK_com1b including information about the phase change of the recovered clock signal CLK_rec by comparing the reference clock signal CLK_ref with the delayed clock signal CLK_del whose phase is shifted by the calibration phase in the recovered clock signal CLK_rec. The pulse width PW of the phase difference signals CLK_com and CLK_com1b may correspond to the phase change of the recovered clock signal CLK_rec.

In operation S143, the NFC circuit 10 generates a signal having a period shorter than a period of a phase difference signal based on the phase difference signal. For example, as shown in FIGS. 8 and 10, the phase detectors 100a and 100b may generate the combination signals CLK_or and CLK_orb having the same pulse width PW as that of the phase difference signals CLK_com and CLK_com1b, but with a reduced period, respectively based on the phase difference signals CLK_com and CLK_com1b. The combination signals CLK_or and CLK_orb may be signals whose period is changed while including information about a phase change.

In operation S145, the NFC circuit 10 generates the output signal D_out corresponding to the phase change based on the combination signals CLK_or and CLK_orb with the reduced period from the CLK com and CLK com1b. For example, as shown in FIGS. 8 and 10, the filter 115a and the filter 115b may respectively receive the combination signal CLK_or and CLK_orb with the reduced period and may output the output voltages V_outa and V_outb having the magnitude of a voltage corresponding to the phase change of the recovered clock signal CLK_rec. The analog-to-digital converter 120 may output the output signal D_out obtained by digitally converting the output voltages V_outa and V_outb.

According to operation S150 of FIG. 3, the controller 300 may receive the output signal D_out having a value corresponding to the phase change of the recovered clock signal CLK_rec, and may detect whether the NFC tag 20 has accessed the NFC circuit 10.

The NFC circuit 10 according to the inventive concepts may detect the NFC tag 20 through the phase change of the recovered clock signal CLK_rec extracted from the detection signal DS. The NFC circuit 10 generates a signal having a pulse width corresponding to the phase change of the recovered clock signal CLK_rec and a relatively high frequency, thereby improving the detection performance of the phase change of the recovered clock signal CLK_rec.

Figure 13A:
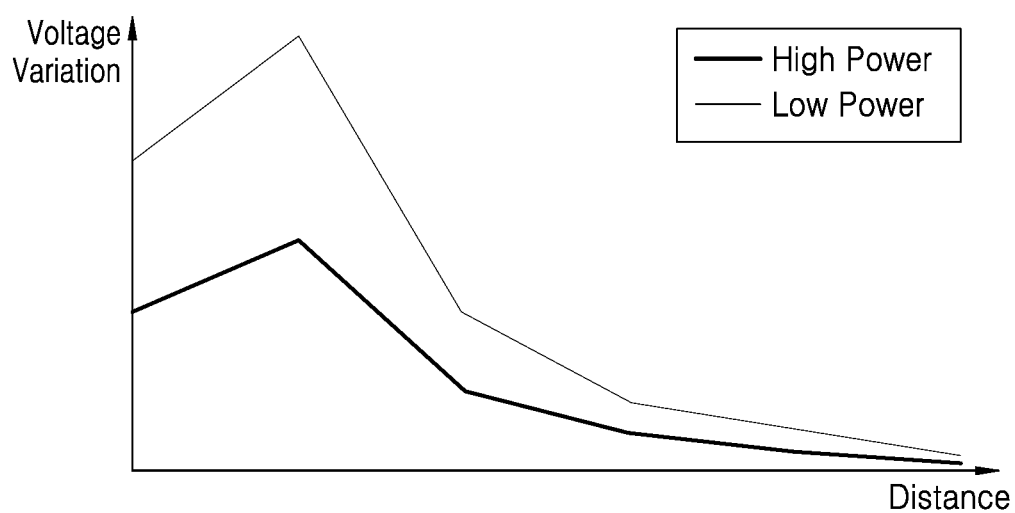
FIG. 13A illustrates operation of an NFC circuit according to embodiments of the inventive concepts.
Figure 13B:
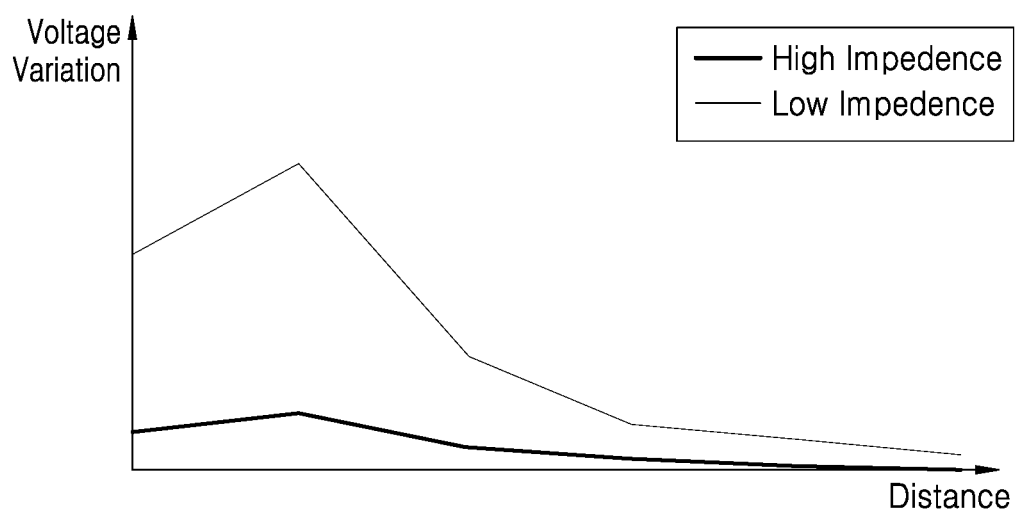
FIG. 13B illustrates operation of an NFC circuit according to embodiments of the inventive concepts.
Figure 13C:
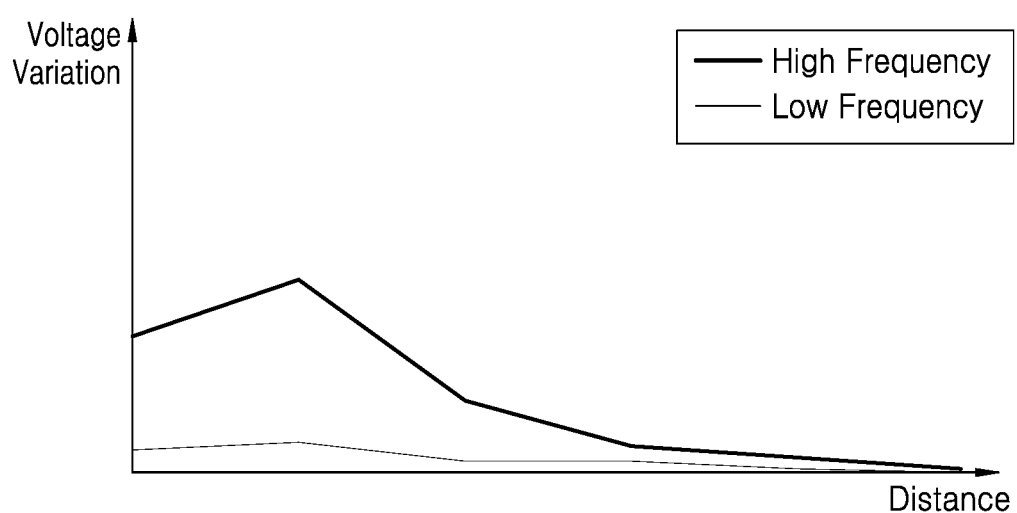
FIG. 13C illustrates operation of an NFC circuit according to embodiments of the inventive concepts.

FIGS. 13A, 13B and 13C illustrate views of an operation of an NFC circuit according to an example embodiment of the inventive concept. FIGS. 13A to 13C illustrate graphs showing the magnitude of an output voltage output from a phase detector according to a distance between an NFC circuit and an NFC tag. FIG. 13A illustrates a graph showing a change in the magnitude of an output voltage according to operating power of a transmitter. FIG. 13B illustrates a graph showing a change in the magnitude of an output voltage according to the impedance of a matching network viewed by the transmitter. FIG. 13C illustrates a graph showing a change in the magnitude of an output voltage according to a resonance frequency of the matching network viewed by the transmitter.

A phase change $\Delta\varphi$ of a recovered clock signal including information about the change in impedance at an antenna terminal according to a distance between the NFC circuit and the NFC tag may satisfy the following Formula 1.

$$\Delta\phi \propto \frac{\omega_r Q}{C_s Z_m} \qquad \text{<Formula 1>}$$

where $\omega_r$ is a resonant frequency of a matching network, Q is a Q factor of an antenna, $C_s$ is a drain-source capacitance of a driver included in the transmitter, and $Z_m$ may be the impedance viewed by the transmitter.

Referring to FIGS. 1, 4, and 13A, the output voltage V_out output from the phase detector 110 may vary according to the distance between the NFC circuit 10 and the NFC tag 20. When the transmitter 400 operates at lower power instead of high power as shown by the respective curves in FIG. 13A, a change in the magnitude of the output voltage V_out according to the distance between the NFC circuit 10 and the NFC tag 20 may increase. The greater the change in the magnitude of the output voltage V_out, the more easily the controller 300 may detect whether the NFC tag 20 has sufficiently accessed the NFC circuit 10.

Referring to Formula 1, a phase change of the recovered clock signal CLK_rec may occur in inverse proportion to a drain-source capacitance of the transistors MP0, MN0, MP1, and MN1 of the first and second drivers 410 and 420 included in the transmitter 400. As the drain-source capacitance of the transistors MP0, MN0, MP1, and MN1 of the first and second drivers 410 and 420 decreases, the phase change of the recovered clock signal CLK_rec may increase and the change in the magnitude of the output voltage V_out increases, and thus, the NFC tag 20 may be easily detected.

The drain-source capacitance of the transistors MP0, MN0, MP1, and MN1 of the first and second drivers 410 and 420 may be reduced as the magnitude of the transmission power supply voltage VDD provided to the first and second drivers 410 and 420 or the magnitude of the first and second drivers 410 and 420 is reduced. Therefore, as power consumption of the first and second drivers 410 and 420 decreases, the drain-source capacitance of the transistors MP0, MN0, MP1, and MN1 of the first and second drivers 410 and 420 may be reduced, the phase change of the recovered clock signal CLK_rec may increase, and a change in a magnitude of the output voltage V_out may also increase.

Referring to FIGS. 1, 4, and 13B, as shown by the respective curves in FIG. 13B, the less the impedance of the matching network 500, the greater the change in the magnitude of the output voltage V_out according to the distance between the NFC circuit 10 and the NFC tag 20. Referring to Formula 1, the phase change of the recovered clock signal CLK_rec may occur in inverse proportion to the impedance of the matching network 500 viewed by the transmitter 400. Therefore, as the impedance of the matching network 500 viewed by the transmitter 400 decreases, the phase change of the recovered clock signal CLK_rec may increase and the change in the magnitude of the output voltage V_out may also increase, and thus, the NFC tag 20 may be easily detected.

Referring to FIGS. 1, 4, and 13C, as shown by the respective curves in FIG. 13C, the greater a resonant frequency of the matching network 500 viewed by the transmitter 400, the greater the change in the magnitude of the output voltage V_out according to the distance between the NFC circuit 10 and the NFC tag 20. Referring to Formula 1, the phase change of the recovered clock signal CLK_rec may occur in proportion to the resonant frequency of the matching network 500 viewed by the transmitter 400. Therefore, as the resonant frequency of the matching network 500 viewed by the transmitter 400 increases, the phase change of the recovered clock signal CLK_rec may increase and the change in the magnitude of the output voltage V_out may also increase, and thus, the NFC tag 20 may be easily detected.

Referring to FIGS. 13A to 13C, in the NFC circuit according to the inventive concepts, as the magnitude of operating power of a transmitter decreases, as impedance of a matching network viewed by a transmitter decreases, and as a resonance frequency of the matching network viewed by the transmitter increases, the change in a magnitude of the output voltage V_out corresponding to a phase change of the recovered clock signal CLK_rec may increase.

When a change in a magnitude of a current flowing through an antenna terminal according to a distance between an NFC circuit and an NFC tag is used to detect an NFC tag or a change in a magnitude of a signal is used to detect an NFC tag, the greater the magnitude of a transmission signal output from a transmitter, the greater the change in magnitude detected. Therefore, power consumption of the NFC circuit may be increased. On the other hand, the NFC circuit according to the inventive concepts detects an NFC tag using the phase change of the recovered clock signal CLK_rec according to the distance between the NFC circuit and the NFC tag, thereby reducing operating power of the transmitter and improving the detection performance of the NFC tag.

Figure 14:
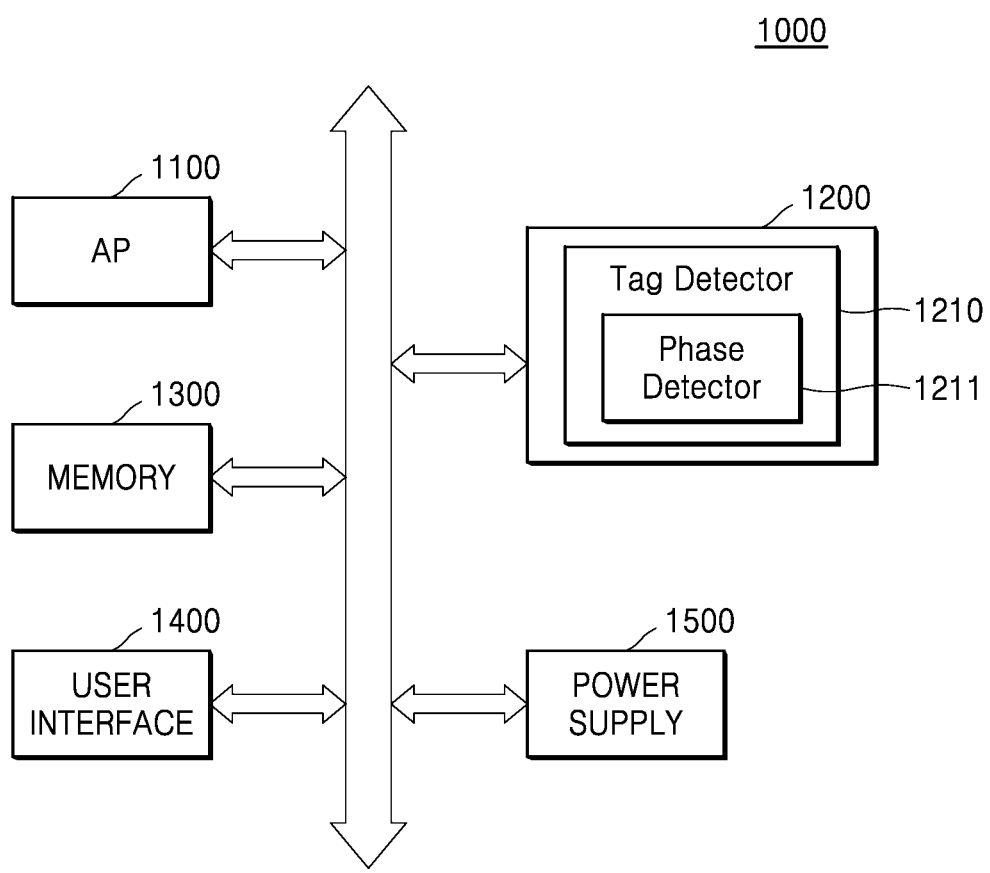
FIG. 14 illustrates a block diagram of an electronic system including an NFC circuit according to embodiments of the inventive concepts.

FIG. 14 illustrates a block diagram of an electronic system including an NFC circuit according to embodiments of the inventive concepts.

Referring to FIG. 14, an electronic system 1000 may include an application processor (AP) 1100, an NFC device 1200, a memory device 1300, a user interface 1400, and a power supply 1500. The electronic system 1000 may be any mobile system such as for example a mobile phone, a smart phone, a personal digital assistant (PDA), a portable multimedia player (PMP), a digital camera, a music player, a handheld game console, a navigation system, or a laptop computer, or the like.

The AP 1100 may control a general operation of the electronic system 1000. The AP 1100 may execute applications that provide Internet browsers, games, moving images, and the like. The AP 1100 may include one processor core (single core) or a plurality of processor cores (multi-core).

The memory device 1300 may store data necessary for an operation of the electronic system 1000. The memory device 1300 may store, for example, a boot image for booting the electronic system 1000, and may store output data to be transmitted to an external device and received input data.

The NFC device 1200, via NFC communication, may transmit the output data stored in the memory device 1300 to the external device, receive the input data from the external device, and store the received data in the memory device 1300. The NFC device 1200 includes a tag detector 1210 according to embodiments of the inventive concepts. The tag detector 1210 includes a phase detector 1211. In detecting an NFC tag, the phase detector 1211 of the NFC device 1200 may detect a phase change of a recovered clock signal recovered from a detection signal. In an embodiment, the phase detector 1211 may be any one of the phase detector 110 of FIG. 5, the phase detector 110*a* of FIG. 8, and the phase detector 110*b* of FIG. 10.

The user interface 1400 may include one or more input devices such as for example a keypad, a touch screen, and the like, and/or one or more output devices such as for example a speaker, a display device, and the like. The power supply 1500 may supply an operating voltage of the electronic system 1000.

While the inventive concepts have been particularly shown and described with reference to embodiments thereof, it should be understood that various changes in form and detail may be made therein without departing from the spirit and scope of the following claims.

What is claimed is:

1. A near-field communication (NFC) circuit comprising:
a transmitter configured to generate a transmission signal based on a reference clock signal and to transmit the transmission signal through an antenna;
a clock recovery circuit configured to receive a detection signal through the antenna responsive to the transmission signal and to recover a recovered clock signal from the detection signal;
a phase detector configured to detect a phase change of the recovered clock signal; and
a controller configured to determine, based on the phase change of the recovered clock signal, whether an NFC tag external to the NFC circuit is located within a communication range of the NFC circuit,
wherein the phase detector comprises:
a clock delay circuit configured to output a delayed clock signal with a phase delay from the recovered clock signal;
a comparator configured to compare a phase of the delayed clock signal with a phase of the reference clock signal and to output a phase difference signal; and
a filter configured to receive the phase difference signal and to output an output voltage having a magnitude corresponding to a phase difference value between the phase of the delayed clock signal and the phase of the reference clock signal.

2. The NFC circuit of claim 1, wherein the clock delay circuit is configured to output the delayed clock signal shifted from the recovered clock signal by a calibration phase, and
the calibration phase is a phase difference value between a phase of the recovered clock signal and the phase of the reference clock signal when the NFC tag is located outside the communication range of the NFC circuit.

3. The NFC circuit of claim 1, wherein the phase difference signal has a pulse width corresponding to a phase difference value between the phase of the delayed clock signal and the phase of the reference clock signal.

4. The NFC circuit of claim 1, further comprising an analog-to-digital converter configured to convert the output voltage of the filter to provide a digital output signal to the controller.

5. The NFC circuit of claim 4, wherein the controller is configured to operate in a reader mode for communicating a data signal with the NFC tag when access of the NFC tag is detected within the communication range of the NFC circuit based on a comparison result obtained by comparing the digital output signal with a reference value.

6. The NFC circuit of claim 1, wherein the phase detector further comprises:
a phase delay circuit configured to generate a first phase difference signal shifted from the phase difference signal by a first phase shift and a second phase difference signal shifted from the phase difference signal by a second phase shift; and
a logic circuit configured to generate a combination signal having a period shorter than a period of the phase difference signal, based on the first phase difference signal and the second phase difference signal;
wherein the filter is configured to receive the combination signal.

7. The NFC circuit of claim 1, wherein the phase detector further comprises:
a first phase delay circuit configured to generate a first delayed clock signal shifted from the delayed clock signal by a first phase shift and a second delayed clock signal shifted from the delayed clock signal by a second phase shift;

a second phase delay circuit configured to generate a first reference clock signal shifted from the reference clock signal by the first phase shift and a second reference clock signal shifted from the reference clock signal by the second phase shift;

a first comparator configured to compare a phase of the first delayed clock signal with a phase of the first reference clock signal and to output a first phase difference signal;

a second comparator configured to compare a phase of the second delayed clock signal with a phase of the second reference clock signal and to output a second phase difference signal; and a logic circuit configured to generate a combination signal having a period shorter than a period of the first phase difference signal and a period of the second phase difference signal, based on the first phase difference signal and the second phase difference signal;

wherein the filter is configured to receive the combination signal.

8. A method of operating a near-field communication (NFC) circuit operable in a standby mode and a reader mode, the method in the standby mode comprising:
transmitting a transmission signal generated based on a reference clock signal through an antenna;
receiving through the antenna a detection signal from an NFC tag external of the NFC circuit according to the transmission signal;
recovering a recovered clock signal from the detection signal;
detecting a phase change of the recovered clock signal; and
detecting the NFC tag based on the phase change of the recovered clock signal,
wherein the detecting of the phase change of the recovered clock signal comprises:
generating a delayed clock signal by shifting a phase of the recovered clock signal; and
comparing a phase of the delayed clock signal with a phase of the reference clock signal to detect the phase change of the recovered clock signal.

9. The method of claim 8, wherein the delayed clock signal is a signal shifted from the recovered clock signal by a calibration phase, and
the calibration phase is a phase difference value between the phase of the recovered clock signal and the phase of the reference clock signal when the NFC tag is located outside a communication range of the NFC circuit.

10. The method of claim 9, further comprising performing a calibration operation to determine the calibration phase in the standby mode.

11. The method of claim 8, wherein the detecting of the phase change further comprises:
generating a phase difference signal comprising information about the phase change of the recovered clock signal; and
generating an output voltage having a magnitude corresponding to the phase change of the recovered clock signal based on the phase difference signal.

12. The method of claim 11, wherein the generating of the output voltage comprises:
generating a signal having a reduced period shorter than a period of the phase difference signal based on the phase difference signal; and generating the output voltage corresponding to the phase change of the recovered clock signal based on the signal having the reduced period.

13. The method of claim 12, wherein the generating of the signal having the reduced period comprises:
generating a first phase difference signal shifted from the phase difference signal by a first phase shift and a second phase difference signal shifted from the phase difference signal by a second phase shift; and
performing an OR operation on the first phase difference signal and the second phase difference signal.

14. The method of claim 8, further comprising switching the standby mode to the reader mode to communicate a data signal with the NFC tag when access of the NFC tag is detected within a communication range of the NFC circuit in the standby mode.

15. A method of operating a near-field communication (NFC) circuit, the method comprising:
operating in a standby mode to detect whether an NFC tag is located within a communication range; and
operating in a reader mode to communicate a data signal with the NFC tag when the NFC tag is located within the communication range,
wherein the operating in the standby mode comprises
transmitting a transmission signal generated based on a reference clock signal through an antenna,
receiving through the antenna a detection signal from the NFC tag according to the transmission signal,
recovering a recovered clock signal from the detection signal, and
detecting the NFC tag based on a phase change of the recovered clock signal,
wherein the detecting of the NFC tag comprises:
generating a delayed clock signal by shifting a phase of the recovered clock signal; and
comparing a phase of the delayed clock signal with a phase of the reference clock signal to detect the phase change of the recovered clock signal.

16. The method of claim 15, wherein the detecting of the NFC tag further comprises:
generating a phase difference signal comprising information about the phase change of the recovered clock signal;
generating a signal having a reduced period shorter than a period of the phase difference signal, based on the phase difference signal; and
generating an output voltage having a magnitude corresponding to the phase change based on the signal having the reduced period.

17. The method of claim 16, wherein the phase difference signal has a pulse width corresponding to the phase change.

18. The method of claim 15, wherein the delayed clock signal is a signal shifted from the recovered clock signal by a calibration phase, and
the calibration phase is a phase difference value between the phase of the recovered clock signal and the phase of the reference clock signal when the NFC tag is located outside a communication range of the NFC circuit.

19. The method of claim 18, further comprising performing a calibration operation to determine the calibration phase in the standby mode.

20. The method of claim 15, further comprising switching the standby mode to the reader mode to communicate a data signal with the NFC tag when access of the NFC tag is detected within a communication range of the NFC circuit in the standby mode.

* * * * *